(12) United States Patent
Chen et al.

(10) Patent No.: US 8,729,987 B2
(45) Date of Patent: May 20, 2014

(54) MAGNETIC SWITCH DEVICE AND ELECTRONIC DEVICE HAVING THE SAME

(75) Inventors: Kuang-Hung Chen, New Taipei (TW); Tsung-Ying Tsai, New Taipei (TW)

(73) Assignee: Wistron Corporation, New Taipei (TW)

( * ) Notice: Subject to any disclaimer, the term of this patent is extended or adjusted under 35 U.S.C. 154(b) by 50 days.

(21) Appl. No.: 13/454,698

(22) Filed: Apr. 24, 2012

(65) Prior Publication Data

US 2013/0038988 A1  Feb. 14, 2013

(30) Foreign Application Priority Data

Aug. 11, 2011  (TW) .............................. 100128765 A

(51) Int. Cl.
*H01H 9/00*    (2006.01)
(52) U.S. Cl.
USPC .......................................... 335/205; 335/207
(58) Field of Classification Search
USPC ........................................................ 335/205
See application file for complete search history.

(56) References Cited

U.S. PATENT DOCUMENTS

| | | | |
|---|---|---|---|
| 6,366,440 B1 * | 4/2002 | Kung .............................. 361/147 |
| 6,922,333 B2 | 7/2005 | Weng et al. |
| 7,336,480 B2 * | 2/2008 | Kwon ...................... 361/679.27 |
| 7,775,567 B2 * | 8/2010 | Ligtenberg et al. ........ 292/251.5 |
| 2008/0061565 A1 | 3/2008 | Lee et al. |

FOREIGN PATENT DOCUMENTS

| | | |
|---|---|---|
| CN | 201837920 U | 5/2011 |
| TW | I241513 B | 10/2005 |
| TW | M307183 U | 3/2007 |

* cited by examiner

*Primary Examiner* — Shawki S. Ismail
*Assistant Examiner* — Lisa Homza
(74) *Attorney, Agent, or Firm* — Muncy, Geissler, Olds & Lowe, P.C.

(57) ABSTRACT

A magnetic switch device and an electronic device having the same are disclosed. The electronic device includes an upper case which includes a first element and a lower case. The magnetic switch device includes a switch part and a driving part, wherein the switch part is mounted on the lower case and includes a second element that can be attached to the first element through magnetic force. The driving part is mounted on the lower case, such that when the driving part is moved, the switch part is enabled by the driving part to make the second element correspond to the first element, allowing the upper case to attach to the lower case; or the switch part is disabled by the driving part to not make the second element correspond to the first element, allowing the upper case not to attach to the lower case.

7 Claims, 12 Drawing Sheets

MAGNETIC SWITCH DEVICE AND ELECTRONIC DEVICE HAVING THE SAME

BACKGROUND OF THE INVENTION

1. Field of the Invention

The present invention relates to a magnetic switch device and an electronic device including the magnetic switch device thereof. More particularly, this present invention relates to a magnetic switch device and an electronic device that causes the upper case and the lower case to attach to or repel each other by changing the switch device position.

2. Description of the Related Art

As technology advances, various kinds of electronic devices are invented; however, to be effective in attracting consumer attention, the modern electronic devices must not only satisfy consumers demand but also be aesthetically pleasing to attract consumers. Therefore, the same series of an electronic device may have many kinds of appearances and colors. Furthermore, the electronic device may have many kinds of interchangeable shells, allowing consumers to change the shell according to their mood or preference, to satisfy consumers' visual sense of aesthetics or desire for entertainment.

In a common electronic device, the shell of which can be changed, uses a snap to fasten the shell, but the snap has the disadvantage that the snap may be broken if the shell is pressed. Therefore, there is a need to invent a new device to solve the problem of the prior art.

SUMMARY OF THE INVENTION

It is an object of the present invention to provide a magnetic switch device that causes the upper case and the lower case to attach to or to repel to each other by changing the switch device position.

It is another object of the present invention to provide an electronic device including the magnetic switch device thereof.

To achieve the abovementioned object, the magnetic switch device of the present invention can be applied to an electronic device which includes an upper case and a lower case, wherein the upper case includes a first element; the magnetic switch device includes a switch part and a driving part, wherein the switch part is mounted in the lower case and includes a second element, and the second element can be attached to the first element through magnetic force; the driving part is mounted in the lower case, such that when the driving part is moved, the switch part is enabled by the driving part such that the second element corresponds to the first element, allowing the upper case to attach to the lower case, or such that the second element does not correspond to the first element, allowing the upper case not to attach to the lower case.

According to one embodiment of the present invention, the switch part of the present invention further comprises an actuating part, and the actuating part is a spring for providing torsion, allowing the switch part to rotate via the torsion, such that the second element can correspond, or not correspond, to the first element.

According to one embodiment of the present invention, the driving part of the present invention comprises a driving bar for pushing and fastening the switch part.

According to one embodiment of the present invention, the magnetic switch device of the present invention further comprises an elastic element located in the driving part and providing an elastic restoring force, allowing the driving part to move via the elastic restoring force.

According to one embodiment of the present invention, the first element of the present invention is a magnet, and the switch part further comprises a third element, wherein the third part is a magnet, and the magnetic pole of the third element is same as the magnetic pole of the first element.

According to one embodiment of the present invention, the switch part is substantially L-shaped; the second element is located on one end of the L-shape, and the third element is located on the other end of the L-shape. When the driving part is moved, the switch part can be rotated, allowing the second element to correspond to the first element, such that the upper case and the lower case are attached to each other by the magnetic force of the opposite magnetic pole, or allowing the third element to correspond to the first element, such that upper case and the lower case are repelled from each other by the magnetic force of the same magnetic pole.

The electronic device of the present invention comprises an upper case, a lower case, and a magnetic switch device, wherein the upper case comprises a first element, and the magnetic switch device is mounted in the lower case, and the second element and the first element of the magnetic switch device can attach to each other via the magnetic force, thereby allowing the second element to correspond to the first element when the switch part is enabled via the movement of the driving part, such that the upper case attaches to the lower case, or the second element not to correspond to the first element, such that the upper case does not attach to the lower case.

DETAILED DESCRIPTION OF THE PREFERRED EMBODIMENT

These and other objects and advantages of the present invention will become apparent from the following descriptions of the accompanying drawings, which disclose several embodiments of the present invention. It is to be understood that the drawings are to be used for purposes of illustration only, and not as a definition of the invention.

Figure 1:
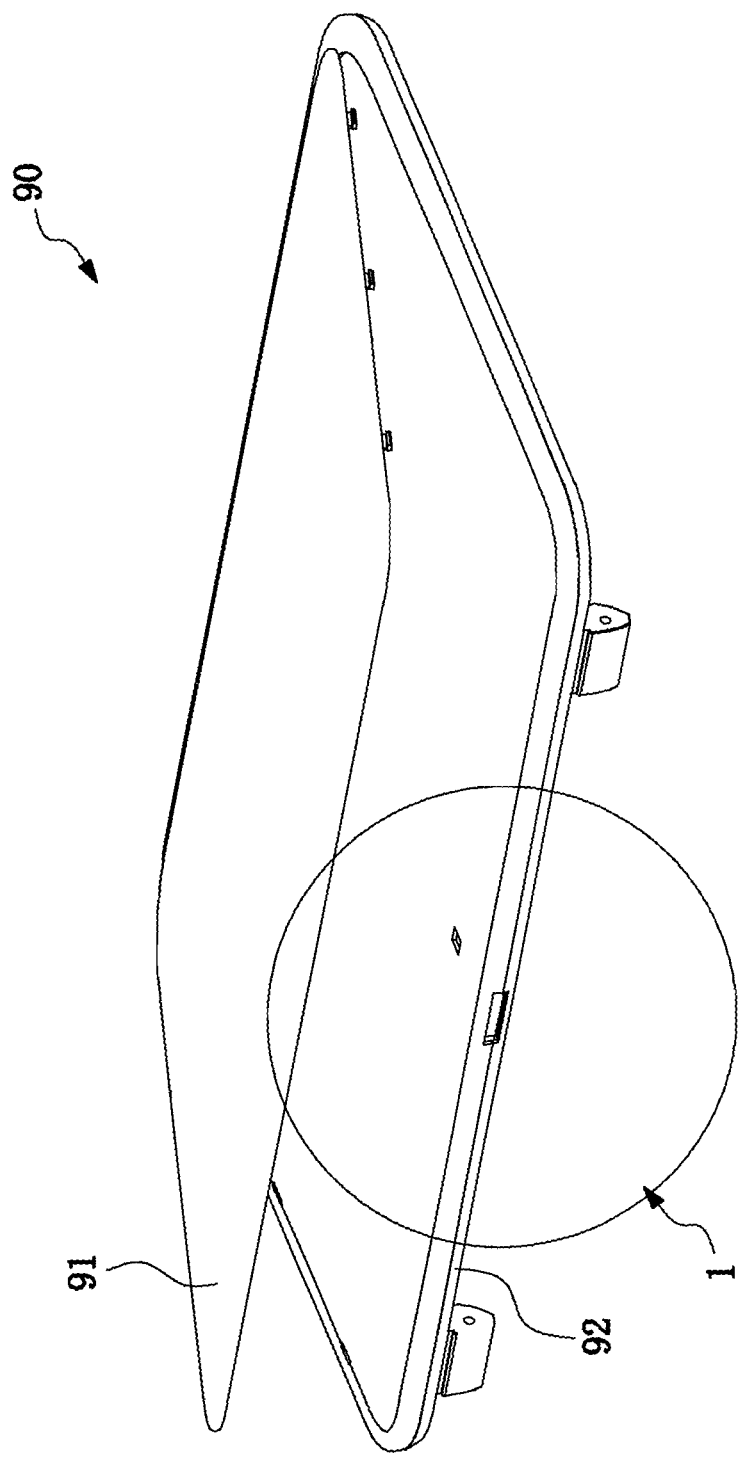
FIG. 1 illustrates a vertical view of the electronic device of the present invention.
Figure 2:
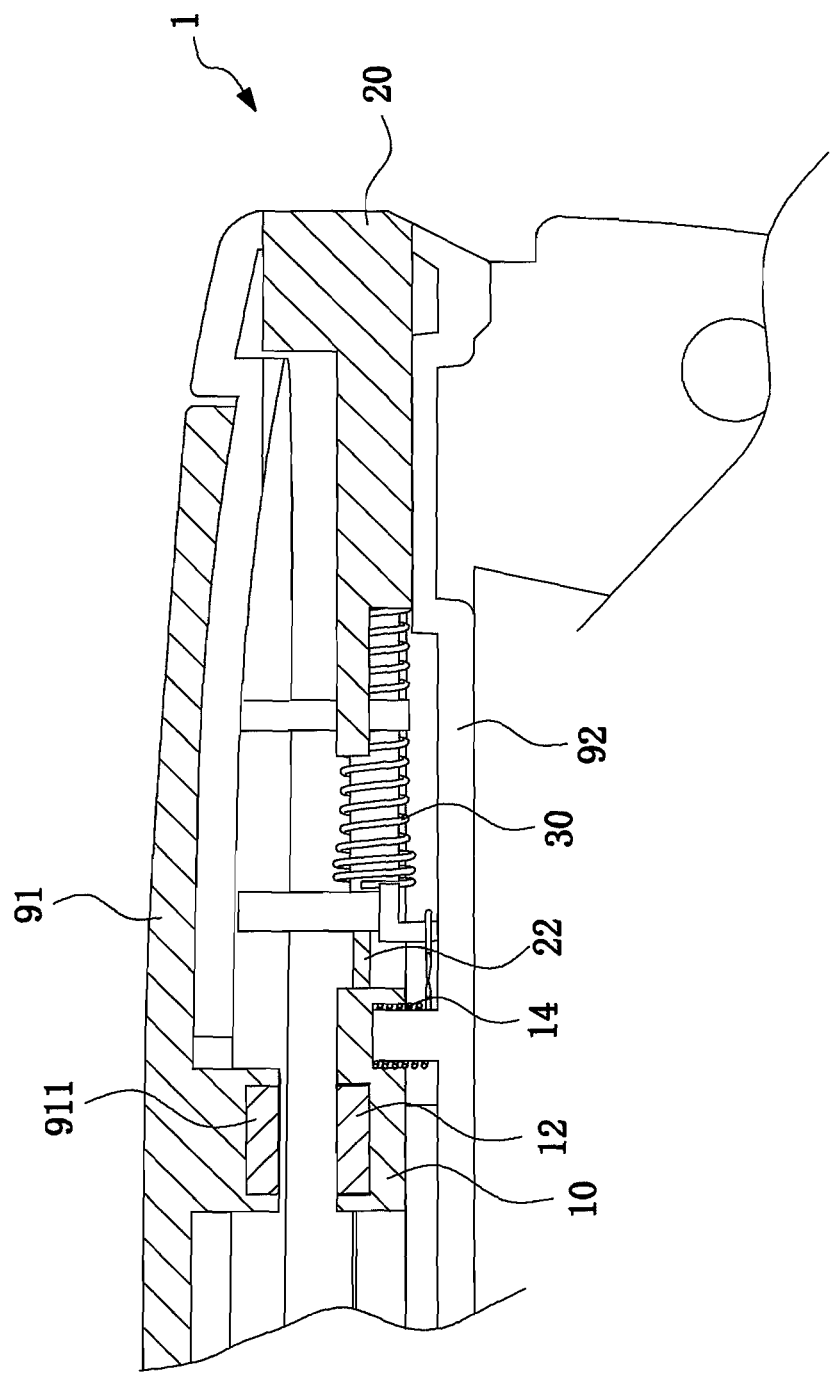
FIG. 2 illustrates a lateral cross-sectional drawing of the electronic device and the magnetic electronic device of the present invention.

Please refer to FIG. 1 and FIG. 2, which illustrate the schematic views of the electronic device and the magnetic electronic device of the present invention.

As shown in FIG. 1, in one embodiment of the present invention, the electronic device 90 includes an upper case 91, a lower case 92, and a magnetic switch device 1. In one embodiment of the present invention, the electronic device 90 is a notebook computer substantially; however, the present invention is not limited to that application, and the electronic device 90 can be also a cell phone, a tablet personal computer, or other similar electronic devices 90 with the upper case 91 and the lower case 92.

As shown in FIG. 2, in one embodiment of the present invention, the magnetic switch device 1 of the present invention is located in the lower case 92 of the electronic device 90, and the upper case 91 of the electronic device 90 includes a first element 911. The magnetic switch device 1 includes a switch part 10, a driving part 20, and an elastic element 30.

Please refer to FIG. 3~FIG. 6, which illustrate schematic views of the actuation and structure of the electronic device and the magnetic electronic device according to the first embodiment of the present invention.

Figure 3:
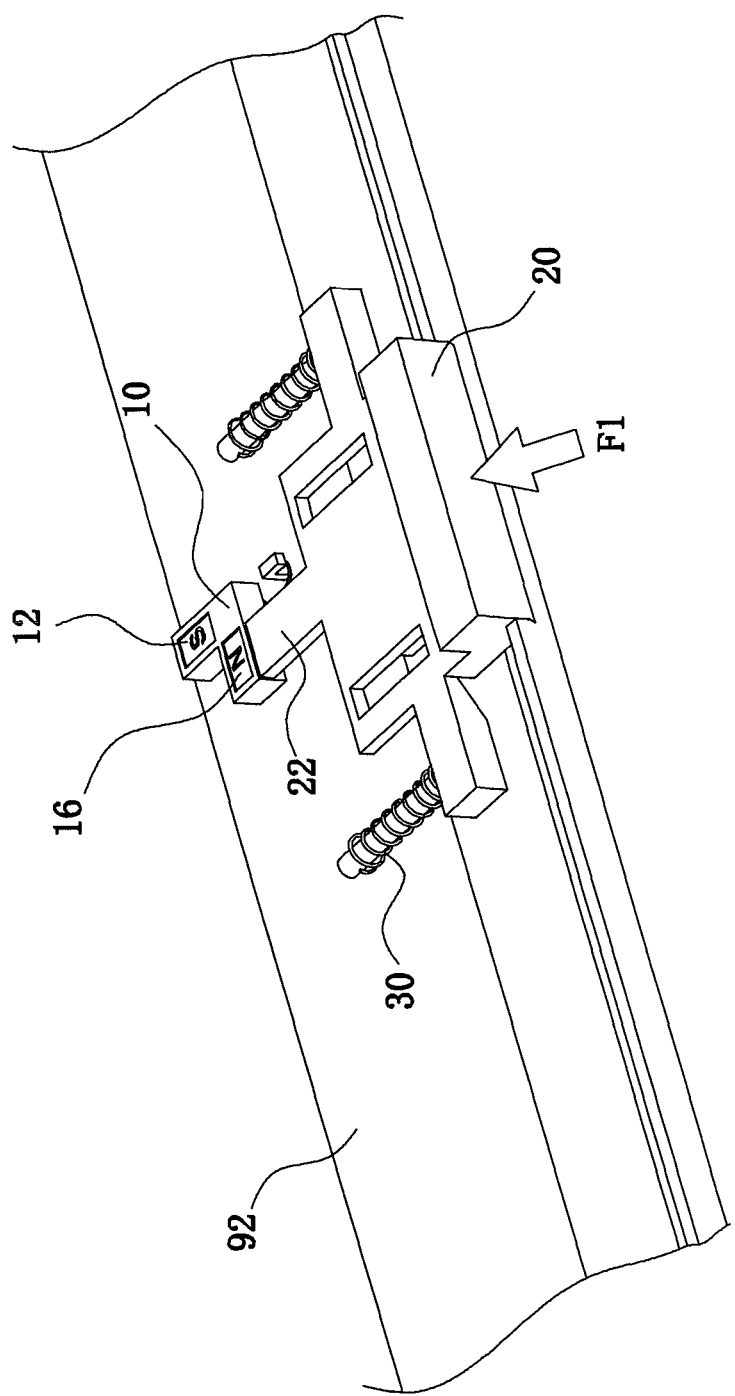
FIG. 3 illustrates an actuation schematic view of the magnetic electronic device according to the first embodiment of the present invention.
Figure 4:
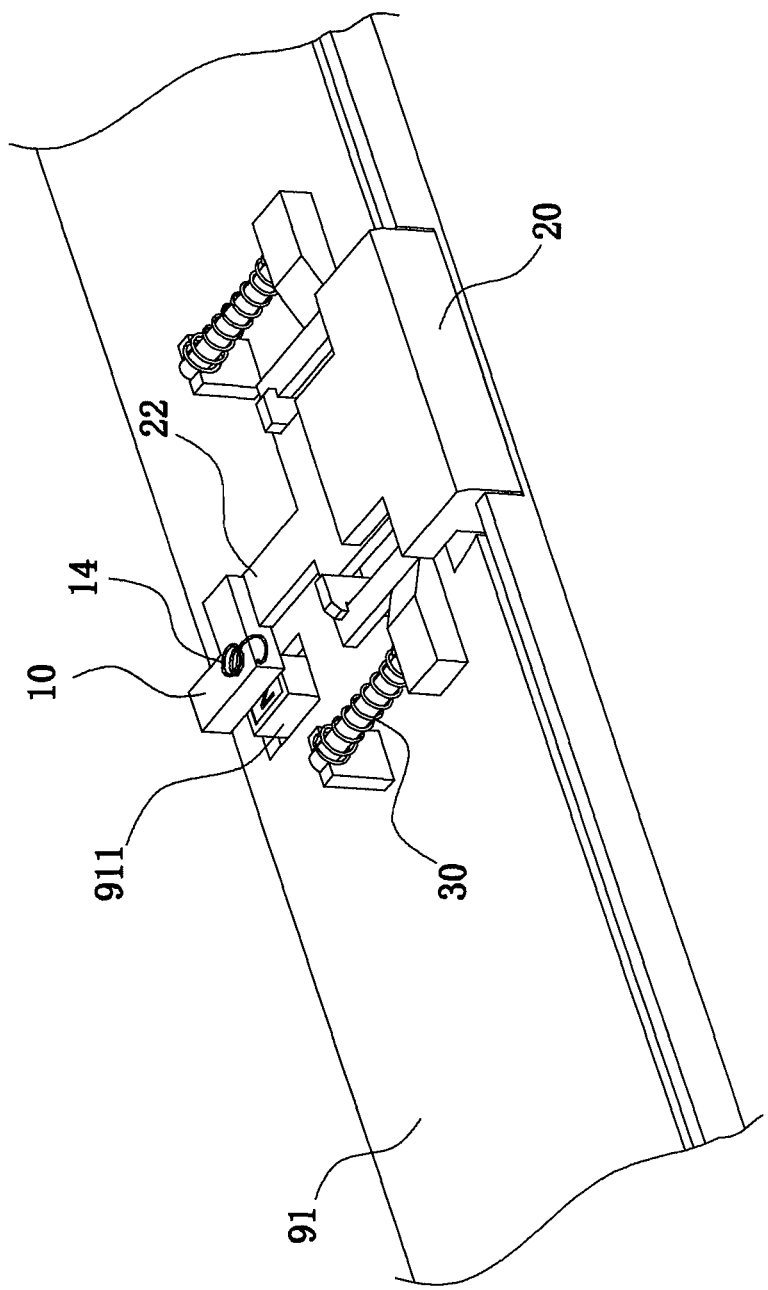
FIG. 4 illustrates a bottom view of the magnetic electronic device before moving according to the first embodiment of the present invention.

As shown in FIG. 3, in the first embodiment of the present invention, the switch part 10 is located in the lower case 92 and is substantially L-shaped; the switch part 10 includes a second element 12, an actuating part 14 (as shown in FIG. 4), and a third element 16, wherein the second element 12 is located on one end of the L-shape, and the third element 16 is located on the other end of the L-shape, and the second element 12 and the first element 911 can attach to each other via the magnetic force. In the first embodiment of the present invention, the second element 12 is a magnet whose magnetic pole is a south magnetic pole, and the first element 911 is a magnet whose magnetic pole is a north magnetic pole. The actuating part 14 is connected to the switch part 10, allowing the switch part 10 to move via the actuating part 14, such that the second element 12 can correspond, or not correspond, to the first element 911. In the first embodiment of the present invention, the actuating part 14 is a torsional spring for providing torsion, allowing the switch part 10 to rotate via the torsion, such that the second element 12 can correspond, or not correspond, to the first element 911. The third element 16 is a magnet, and the magnetic pole of the third element 16 is the same as that of the first element 911, both being north magnetic poles.

The driving part 20 is located in the lower case 92; when the driving part 20 is moved, the switch part 10 is enabled by the driving part 20, allowing the second element 12 to correspond to the first element 911, such that the upper case 91 can attach to the lower case 92, or allowing the second element 12 not to correspond to the first element 911, such that the upper case 91 cannot attach to the lower case 92. In the embodiment of the present invention, the driving part 20 includes a driving bar 22 for pushing and fastening the switch part 10.

The elastic element 30 is mounted in the driving part 20 for providing an elastic restoring force, such that the driving part 20 can be moved by the elastic restoring force.

Figure 5:
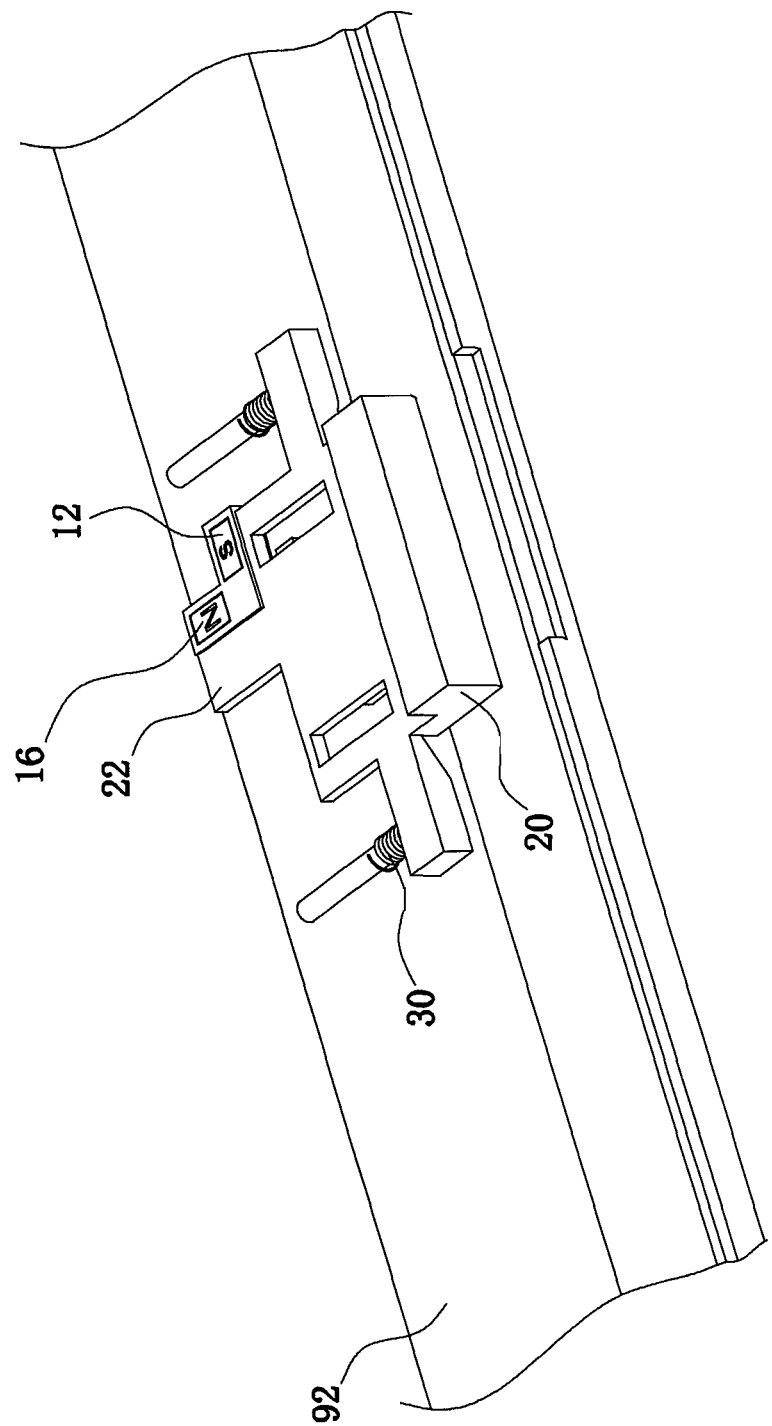
FIG. 5 illustrates a vertical view of the magnetic electronic device after moving according to the first embodiment of the present invention.
Figure 6:
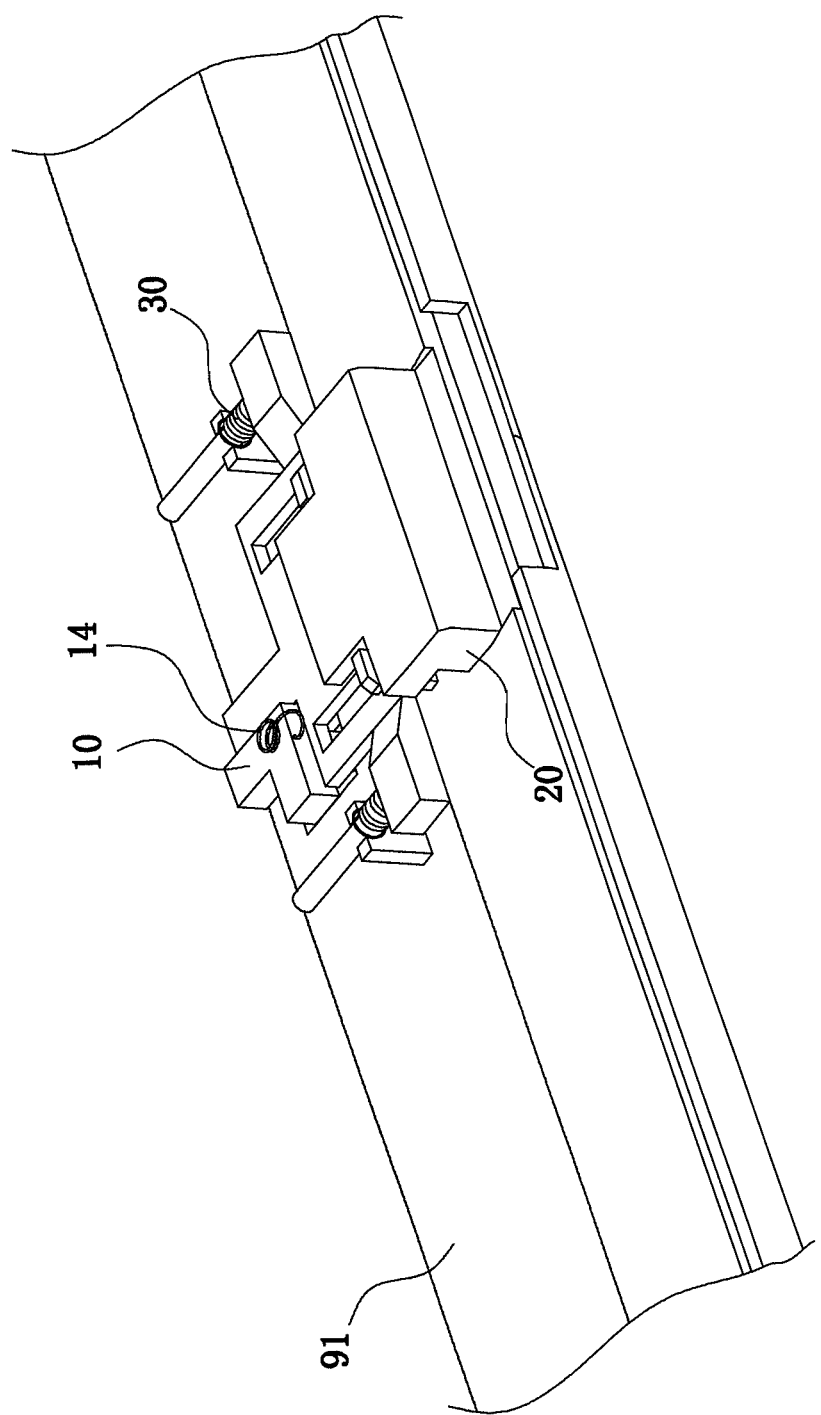
FIG. 6 illustrates a bottom view of the magnetic electronic device after moving according to the first embodiment of the present invention.

Please continue referring to FIG. 3~FIG. 6. As shown in FIG. 3, before the driving part 20 is pushed, the second element 12 of the switch part 10 corresponds to the first element 911, and the magnetic poles of the second element and the first element are opposites, allowing the upper case 91 and the lower case 92 to attach to each other, such that the upper case 91 is fastened via the magnetic force. When a user pushes the driving part 20 toward the inside (as the direction F1) so that the driving part 20 presses the switch part 10, then the switch part 10 will be rotated as shown in FIG. 5; meanwhile, because the magnetic pole of the third element 16 is the same as the magnetic pole of the first element 911 (both of which are north magnetic poles), the upper case 91 and the lower case 92 repel each other and disengage via the magnetic force.

Figure 7:
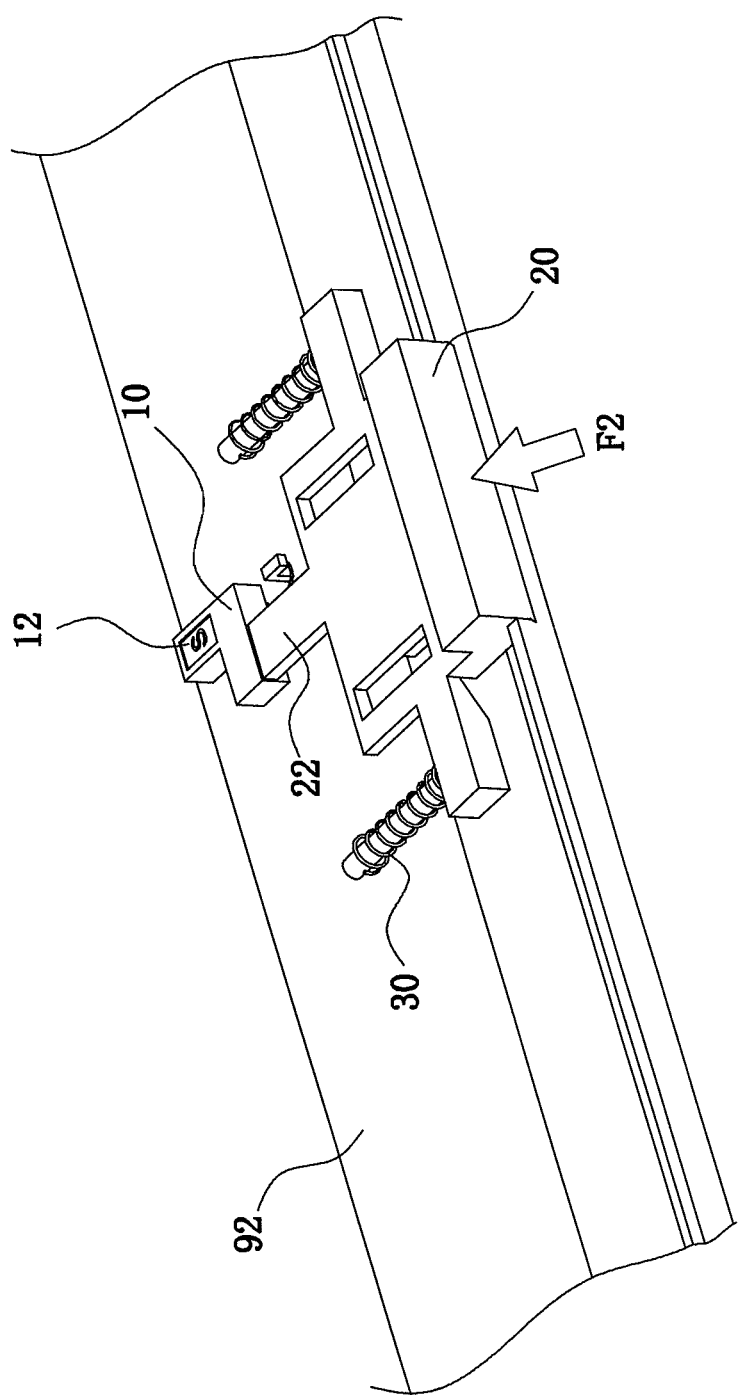
FIG. 7 illustrates an actuation schematic view of the magnetic electronic device according to the second embodiment of the present invention.
Figure 8:
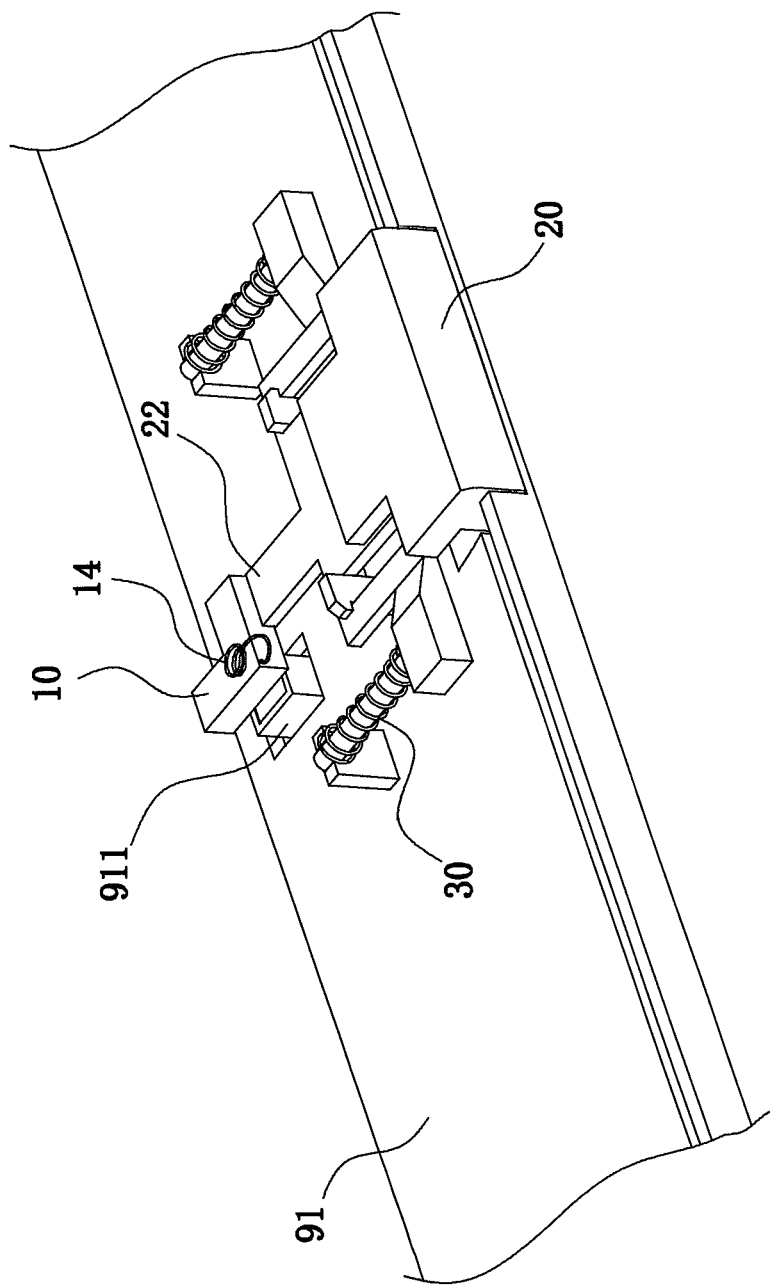
FIG. 8 illustrates a bottom view of the magnetic electronic device before moving according to the second embodiment of the present invention.
Figure 9:
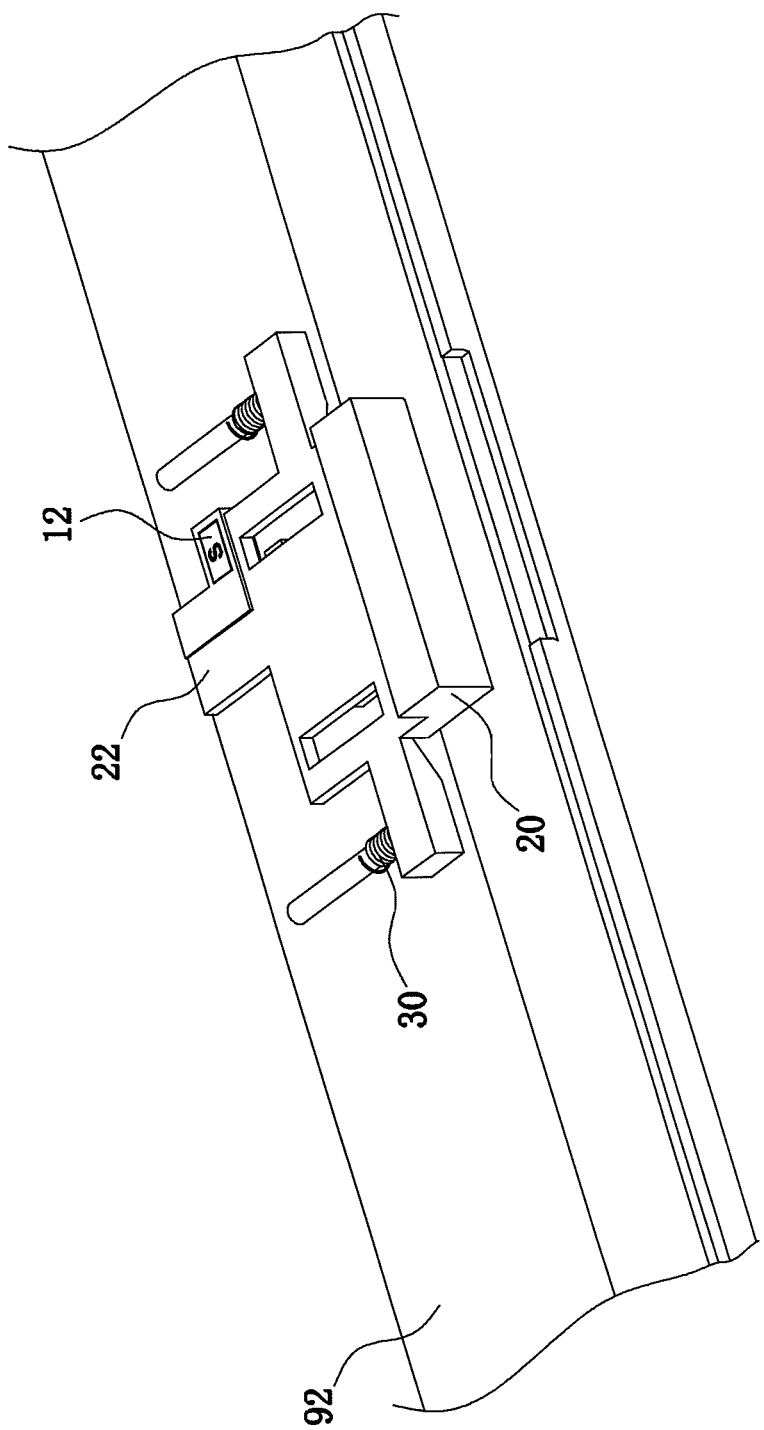
FIG. 9 illustrates a vertical view of the magnetic electronic device after moving according to the second embodiment of the present invention.

Please refer to FIG. 7~FIG. 9, which illustrate the schematic views of the actuation and structure of the magnetic electronic device according to the second embodiment of the present invention.

As shown in FIG. 7, in the second embodiment of the present invention, the difference between the second embodiment and the first embodiment is that the switch part 10 does not include the third element 16, and the first element 911 is not a magnet but an iron part or other part with iron (as shown in FIG. 8), such that the first element 911 can still be attached to the second element 12. When a user pushes the driving part 20 toward the inside (as the direction F2) so that the driving part 20 presses the switch part 10, the switch part 10 rotates as in FIG. 9; then there will not be any magnetic force between the third element 16 and the first element 911, and therefore the upper case 91 and the lower case 92 cannot attach to each other anymore, such that the user can move the upper case 91 easily. To be noted is that, in the embodiment, the first element 911 is an iron part, but the first element 911 of present invention is not limited to that application, and it may be a magnet with the opposite magnetic pole to the second element 12 as the first embodiment.

Figure 10:
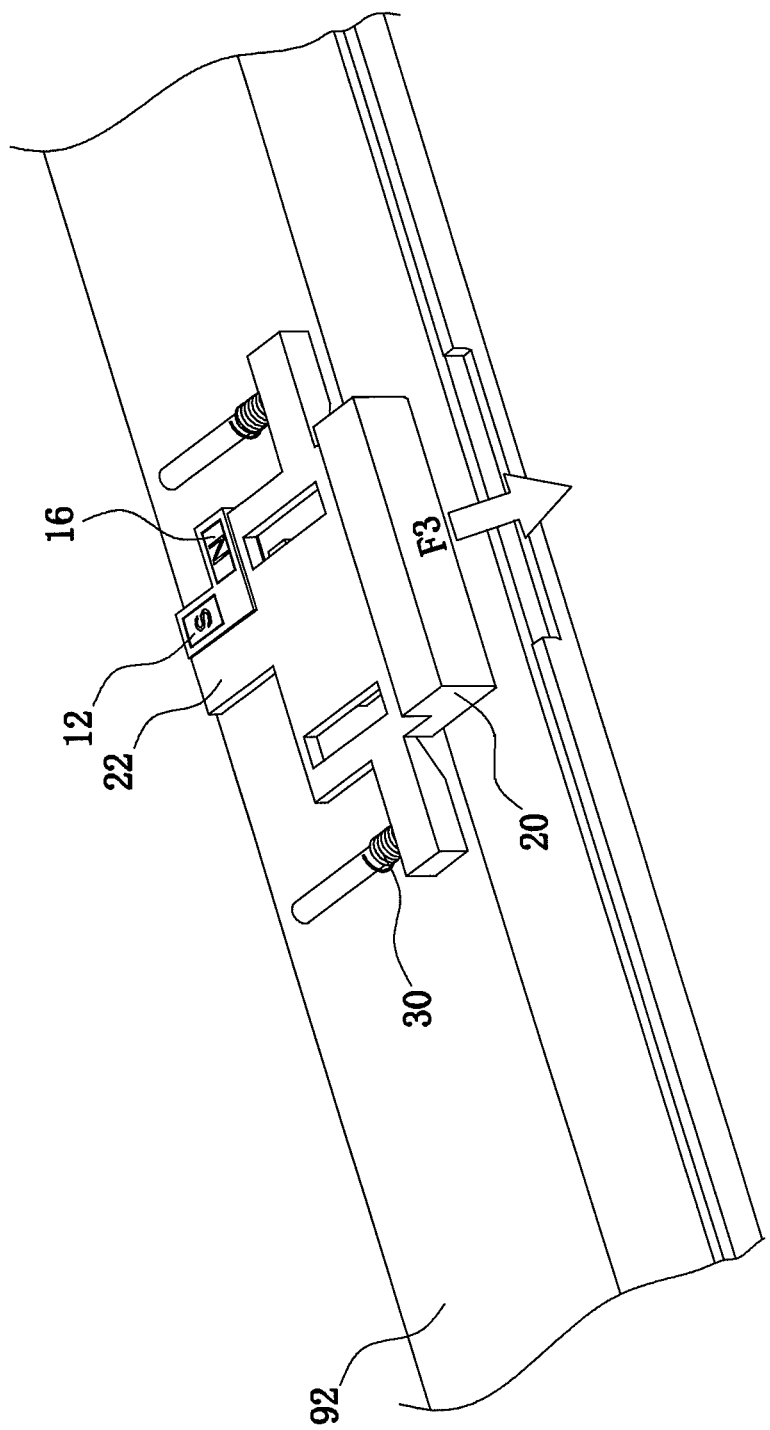
FIG. 10 illustrates an actuation schematic view of the magnetic electronic device according to the third embodiment of the present invention.
Figure 11:
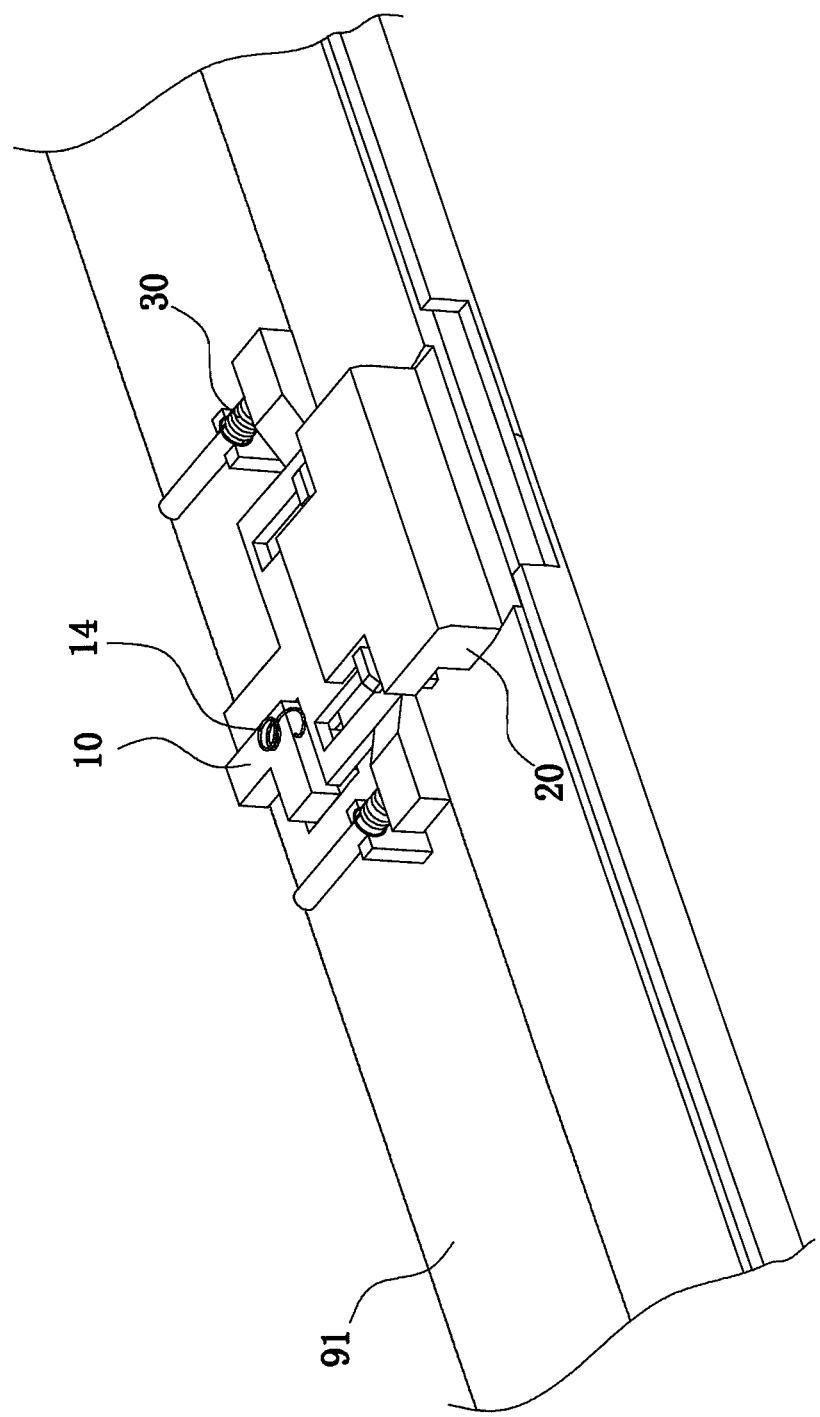
FIG. 11 illustrates a bottom view of the magnetic electronic device before moving according to the third embodiment of the present invention.
Figure 12:
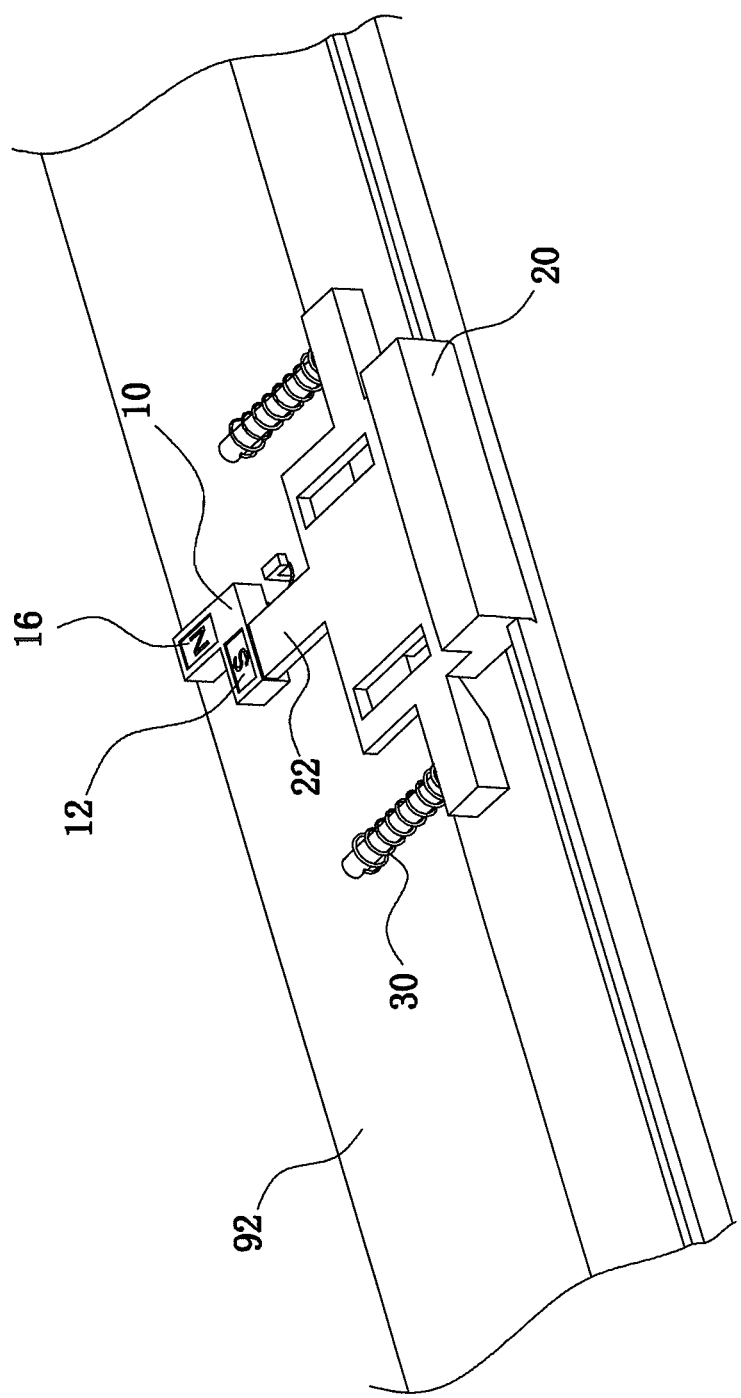
FIG. 12 illustrates a vertical view of the magnetic electronic device after moving according to the third embodiment of the present invention.

Please refer to the FIG. 10~FIG. 12, which illustrate the schematic views of the actuation and structure of the magnetic electronic device according to the third embodiment of the present invention.

As shown in FIG. 10, in the third embodiment of the present invention, the method of driving of the driving part 20 is opposite to the abovementioned embodiment.

The driving part 20 fastens the switch part 10 via the connecting bar 22, allowing the second element 12 to correspond to the first element 911, such that the upper case 91 and the lower case 92 can attach to each other. When a user presses the driving part 20, the driving part 20 will move toward the outside (as the direction F3) to disengage from the switch part 10 via the elastic force of the elastic element 30; at the moment, since the switch part 10 is not fastened by the driving bar 22, the switch part 10 can rotate to the state as shown in FIG. 12 via the torsion of the actuating part 14 (as shown in FIG. 11), allowing the upper case 91 and the lower case 92 to disengage from each other via the force of repulsion generated by the first element 911 and the third element 16. The structure and the magnetic pole of the present embodiment are same as in the first embodiment, so there is no need for description here.

It is to be understood that the abovementioned embodiments are only for purposes of illustration and that the present invention is not limited to those designs. For example, the movement of the switch part 10 is not limited to rotating; the switch part 10 can be designed to move from outside to inside, or from inside to outside, and the actuating part 14 can be replaced with a telescopic spring, an elastic piece, or other similar devices.

Although the present invention has been explained in relation to its preferred embodiments, it is to be understood that many other possible modifications and variations can be made without departing from the spirit and scope of the invention as hereinafter claimed.

What is claimed is:

1. A magnetic switch device applied to an electronic device, which comprises an upper case and a lower case, and the upper case comprises a first element, the magnetic switch device comprising:
   a switch part located in the lower case, and the switch part comprises a second element, wherein the switch part is substantially L-shaped, and the second element is located in one end of the L-shape;
   wherein the second element and the first element can attach to each other via a magnetic force; and
   a driving part located in the lower case, such that when the driving part is moved, the switch part is rotated by the driving part, allowing the second element to correspond to the first element, such that the upper case attaches to the lower case; or allowing the second element not to correspond to the first element, such that the upper case does not attach to the lower case;
   wherein the switch part comprises an actuating part used for actuating the switch part, allowing the second element to correspond, or not to correspond, to the first element;
   wherein the driving part comprises a driving bar for pushing and fastening the switch part;
   wherein the first element is a magnet, and the switch part comprises a third element which is a magnet and has the same magnetic pole as the first element;
   wherein the switch part is substantially L-shaped, and the second element is located and the third element is located in the other end of the L-shape;
   wherein when the driving part is moved, the switch part can be rotated, allowing the second element to correspond to the first element, such that the upper case and the lower case are attached to each other by the magnetic force of opposite magnetic pole; or allowing the third element to correspond to the first element, such that the upper case and the lower case are repelled from each other by the magnetic force of the same magnetic pole.

2. The magnetic switch device as claimed in claim 1, wherein the actuating part is a spring for providing torsion so that the switch part can be rotated via the torsion, allowing the second element to correspond, or not to correspond, to the first element.

3. The magnetic switch device as claimed in claim 2, further comprising an elastic element located in the driving part for providing an elastic restoring force, allowing the driving part to move via the elastic restoring force.

4. The magnetic switch device as claimed in claim 1, wherein the second element is a magnet.

5. A magnetic switch device applied to an electronic device comprising a upper case and a lower case, wherein the upper case comprises a first element which is a magnet, the magnetic switch device comprising:
   a switch part located in the lower case, and the switch part is substantially L-shaped; the switch part comprises:
      a second element located in one end of the L-shape, and the second element is a magnet whose magnetic pole is opposite to that of the first element;
      a third element located in the other end of the L-shape, and the magnetic pole of the third element is the same as that of the first element; and
      an actuating part for actuating the switch part, allowing the second element to correspond to the first element, or allowing the third element to correspond to the first element; and
   a driving part located in the lower case, such that when the driving part is moved, the switch part is enabled by the driving part, allowing the second element to correspond to the first element, such that the upper case attaches to the lower case via the opposite magnetic polarities; or allowing the third element to correspond to the first element, such that the upper case repels the lower case via the same magnetic poles.

6. An electronic device comprising:
an upper case;
a lower case; and
a magnetic switch device as claimed in claim 1, the magnetic switch device being located in the lower case, allowing the upper case to attach to or be repelled from the lower case.

7. An electronic device comprising:
an upper case;
a lower case; and
a magnetic switch device as claimed in claim 5, the magnetic switch device being located in the lower case, allowing the upper case to attach to or be repelled from the lower case.

* * * * *